United States Patent
Kang

(10) Patent No.: US 7,099,177 B2
(45) Date of Patent: Aug. 29, 2006

(54) NONVOLATILE FERROELECTRIC MEMORY DEVICE HAVING POWER CONTROL FUNCTION

(75) Inventor: Hee Bok Kang, Daejeon (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 65 days.

(21) Appl. No.: 10/876,466

(22) Filed: Jun. 28, 2004

(65) Prior Publication Data

US 2005/0117379 A1   Jun. 2, 2005

(30) Foreign Application Priority Data

Dec. 1, 2003   (KR) .................. 10-2003-0086454

(51) Int. Cl.
*G11C 11/22*   (2006.01)
*G11C 7/00*   (2006.01)

(52) U.S. Cl. .................. 365/145; 365/189.11
(58) Field of Classification Search ........... 365/189.05, 365/189.11, 145
See application file for complete search history.

(56) References Cited

U.S. PATENT DOCUMENTS

| | | | |
|---|---|---|---|
| 5,953,261 A * | 9/1999 | Furutani et al. ....... | 365/189.05 |
| 6,272,594 B1 | 8/2001 | Gupta | |
| 6,285,576 B1 * | 9/2001 | Kang .................. | 365/145 |
| 6,342,794 B1 * | 1/2002 | Turner et al. .......... | 326/68 |
| 6,363,439 B1 | 3/2002 | Battles et al. | |
| 6,483,357 B1 * | 11/2002 | Kato et al. ............ | 327/143 |
| 6,525,362 B1 * | 2/2003 | Sadayuki ............ | 257/298 |
| 6,671,147 B1 * | 12/2003 | Ker et al. ............. | 361/56 |
| 6,809,952 B1 * | 10/2004 | Masui ................ | 365/145 |
| 6,819,584 B1 * | 11/2004 | Noh .................. | 365/145 |

FOREIGN PATENT DOCUMENTS

KR   2002-0085533   12/2002

* cited by examiner

*Primary Examiner*—Amir Zarabian
*Assistant Examiner*—Anthan Tran
(74) *Attorney, Agent, or Firm*—Heller Ehrman LLP

(57) ABSTRACT

A nonvolatile ferroelectric memory device having a power control function improves a sensing margin by stably controlling a power applied to a cell capacitor. In the nonvolatile ferroelectric memory device, an operating voltage of the cell is controlled depending on an external supply voltage in order to apply the highest voltage to the cell capacitor, and a power voltage obtained by dropping an external power voltage is applied to adjacent circuits in order to apply a lower voltage to adjacent circuits. Additionally, different ESD (Electro Static Discharge) circuits for performing an electrostatic discharge function in an input/output unit are embodied depending on the supplied voltage level, thereby stabilizing power.

13 Claims, 12 Drawing Sheets

NONVOLATILE FERROELECTRIC MEMORY DEVICE HAVING POWER CONTROL FUNCTION

BACKGROUND OF THE INVENTION

1. Field of the Invention

The present invention generally relates to a nonvolatile ferroelectric memory device, and more specifically, to a technology of stably controlling a power source applied to a cell capacitor, thereby improving a sensing margin.

2. Description of the Prior Art

Generally, a ferroelectric random access memory (hereinafter, referred to as 'FeRAM') has attracted considerable attention as next generation memory device because it has a data processing speed as fast as a Dynamic Random Access Memory DRAM and conserves data even after the power is turned off.

The FeRAM having structures similar to the DRAM includes the capacitors made of a ferroelectric substance, so that it utilizes the characteristic of a high residual polarization of the ferroelectric substance in which data is not deleted even after an electric field is eliminated.

The technical contents on the above FeRAM are disclosed in the Korean Patent Application No. 2002-85533 by the same inventor of the present invention. Therefore, the basic structure and the operation on the FeRAM are not described herein.

Meanwhile, a semiconductor memory chip requires various operating powers ranging from 1V to 5V depending on configuration and characteristics of the system. Specifically, as a pattern of the semiconductor memory device becomes microscopic, the operating voltage of a CMOS device drops at the same ratio. When the operating voltage of the CMOS device is dropped, power consumption also decreases.

In general, a capacitor included in the conventional FeRAM cell corresponds to a device which requires a relatively higher voltage. As a result, when the FeRAM cell is operated, a power voltage VCC is pumped to rise to an external power voltage VEXT level.

However, since the external power voltage VEXT having a high voltage level is also applied to adjacent circuits which do not require the high voltage except a cell capacitor, the power consumption of the semiconductor memory device increases. In addition, the area of the whole system board also increases because an additional power supply circuit for controlling power of the memory cell is included in the outside of a chip.

SUMMARY OF THE INVENTION

Accordingly, it is the first object of the present invention to improve a sensing margin of a cell and reduce unnecessary power consumption by controlling an operating voltage of the cell depending on an external supply voltage VEXT and applying a power voltage VCC obtained by dropping an external power voltage to adjacent circuits.

It is the second object of the present invention to stabilize power by embodying a different configuration of an Electro Static Discharge (hereinafter, referred to as "ESD") circuit for performing an electrostatic discharge function in an input/output unit corresponding to voltage levels of various operating powers.

It is the third object of the present invention to simplify configuration of a system board and vary a regulation range of power by positioning a power supply circuit not in the outside but in the inside of a chip.

In an embodiment, a nonvolatile ferroelectric memory device having a power control function comprises a voltage drop unit, a nonvolatile ferroelectric circuit unit, a level shifter and an input/output unit. The voltage drop unit drops an external power voltage to supply a power voltage. The nonvolatile ferroelectric circuit unit comprising a nonvolatile ferroelectric capacitor reads/writes data stored in a cell depending on the power voltage. The level shifter shifts data read from the nonvolatile ferroelectric circuit unit to the external power voltage level. The input/output unit driven by the level of the external power voltage buffers input data and output data of the level shifter to control input/output operations.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
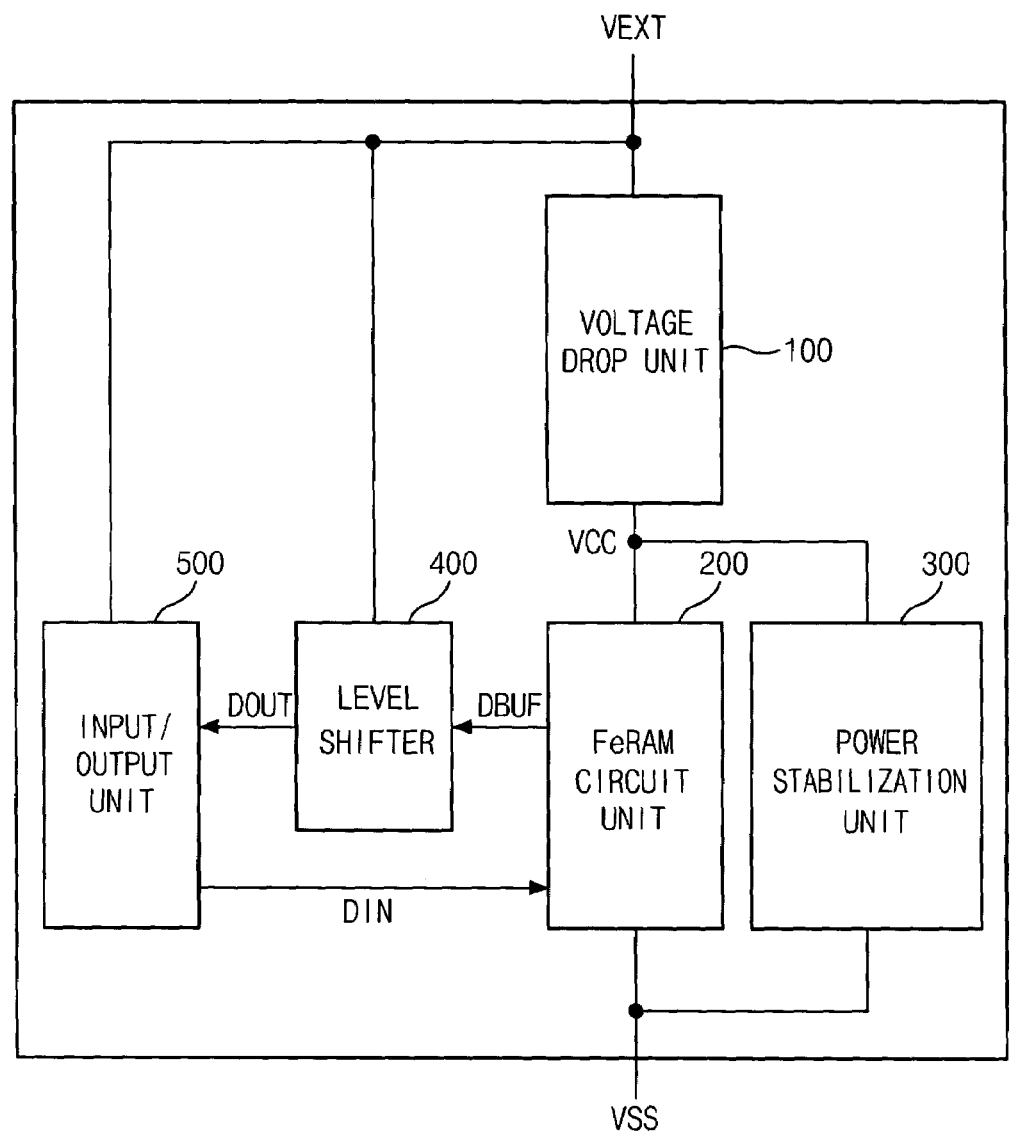
FIG. 1 is a diagram of a nonvolatile FeRAM device having a power control function according to an embodiment of the present invention.

FIG. 1 is a diagram of a nonvolatile FeRAM device having a power control function according to an embodiment of the present invention.

In an embodiment, the nonvolatile FeRAM device comprises a voltage drop unit 100, a FeRAM circuit unit 200, a power stabilization unit 300, a level shifter 400 and an input/output unit 500.

Here, the voltage drop unit 100 drops an external power voltage VEXT applied externally to a predetermined level, and supplies a power voltage VCC.

The FeRAM circuit unit 200 comprises cell arrays and a regulation circuit for driving the nonvolatile FeRAM device. The FeRAM circuit unit 200 drives a memory cell depending on the power voltage VCC supplied from the voltage drop unit 100. Also, the FeRAM circuit unit 200 stores input data DIN applied through the input/output unit 500, and drives data stored in the cell to generate output data DBUF.

The power stabilization unit 300 removes noise generated from the power voltage VCC supplied from the voltage drop unit 100, and stabilizes the voltage.

The level shifter 400 shifts a voltage level of the output data DBUF applied from the FeRAM circuit unit 200 depending on the external power voltage VEXT, and generates output data DOUT. In other words, the level shifter 400 shifts the voltage level of the output data DBUF having a power voltage VCC level to convert the output data DBUF into the output data DOUT having an external power voltage VEXT level, and outputs the converted data to the input/output unit 500.

The input/output unit 500 is driven by the external power voltage VEXT level, and outputs the input data DIN externally applied through an input pad to the FeRAM circuit unit 200. The input/output unit 500 buffers the output data DOUT applied through the level shifter 400, and outputs the buffered data to an output pad.

Figure 2:
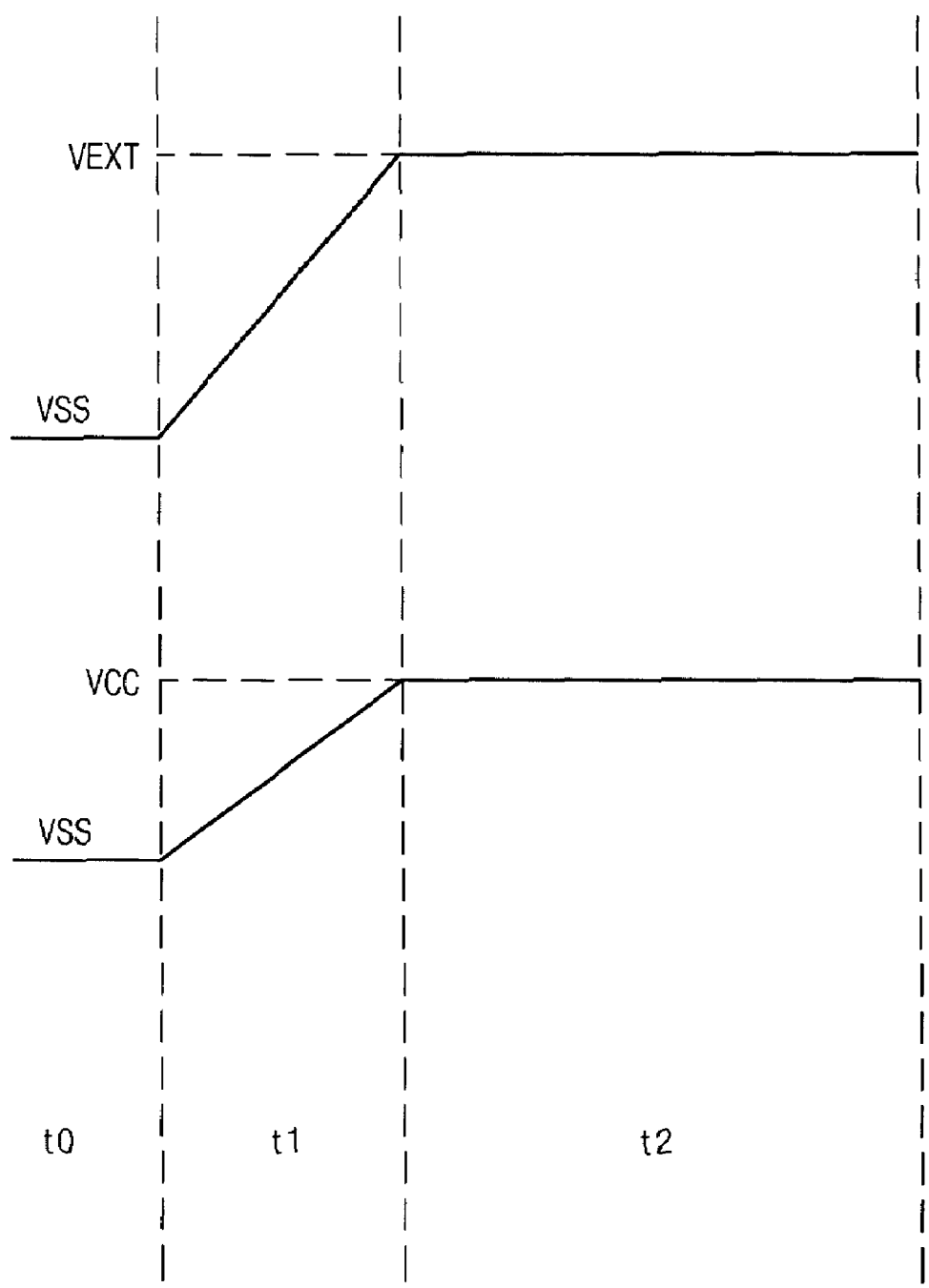
FIG. 2 is a diagram illustrating a power supply of the nonvolatile FeRAM device having a power control function according to an embodiment of the present invention.

FIG. 2 is waveform diagram illustrating the operating voltage of the nonvolatile FeRAM device having a power control function according to an embodiment of the present invention.

In an interval t0, a power is not supplied to a chip. When an interval t1 starts, the levels of the external power voltage VEXT and the power voltage VCC start to rise. Then, when an interval t2 starts, the voltage of the external power voltage VEXT is dropped so that the power voltage VCC is stably generated.

Here, the voltage drop unit 100 drops the level of the external power voltage VEXT to supply the dropped voltage level to the FeRAM circuit unit 200. The FeRAM circuit unit 200 drives the memory cell depending on the power voltage VCC level.

Figure 3:
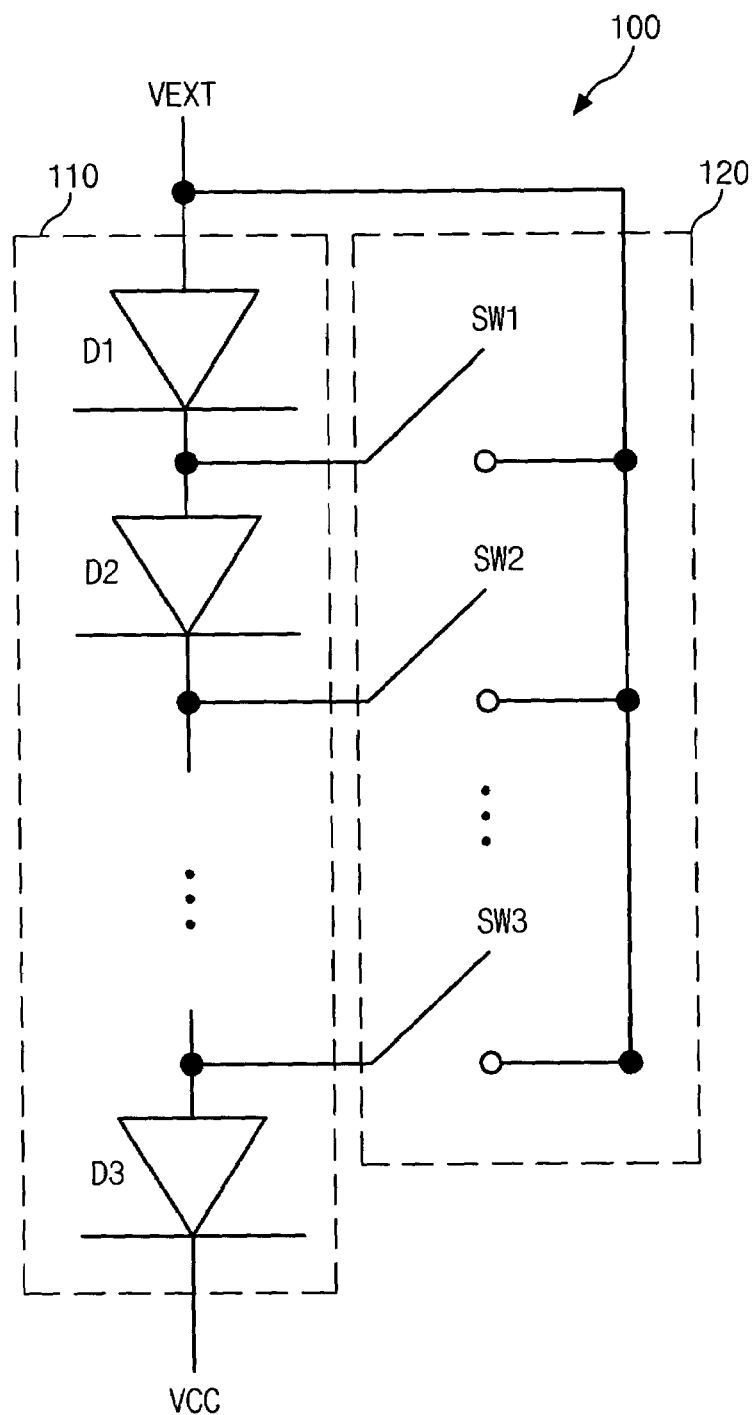
FIG. 3 is a circuit diagram of a voltage drop unit according to an embodiment of the present invention.

FIG. 3 is a circuit diagram of the voltage drop unit 100 of FIG. 1.

The voltage drop unit 100 comprises a voltage drop drive unit 110 and a switching unit 120.

Here, the voltage drop drive unit 110 comprises a plurality of diode devices D1~D3 connected serially for sequentially dropping the external power voltage VEXT. Here, each of the plurality of diode devices D1~D3 comprises a PN diode.

The switching unit 120 comprises a plurality of switches SW1~SW3 for controlling connection of the plurality of diode devices D1~D3 in order to determine which one of the diode devices D1~D3 is used.

The voltage drop unit 100 generates the dropped power voltage VCC depending on the selective usage number of the diode devices D1~D3 serially connected. For example, when the switch SW1 is connected, a short state is caused so that the diode device D1 does not serve as a voltage drop device. The other switches SW2 and SW3 which are disconnected can drop the external power voltage VEXT by the diode devices D2 and D3.

In an embodiment, an additional power supply circuit is positioned not in the outside of the chip but in the inside of the chip. As a result, the configuration of the system board is simplified, and the regulation range of the power is varied.

Figure 4:
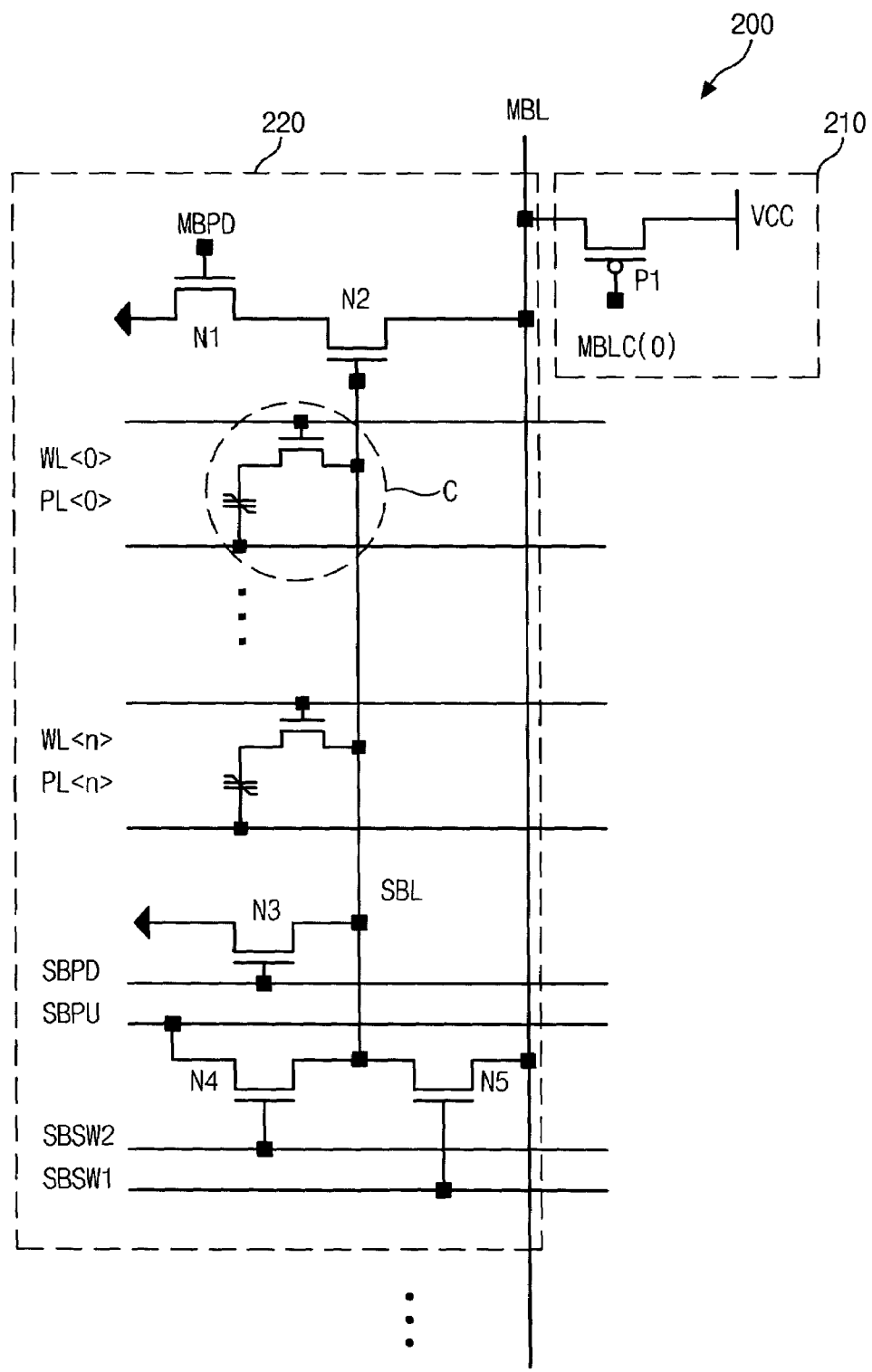
FIG. 4 is a circuit diagram of a FeRAM circuit unit according to an embodiment of the present invention.

FIG. 4 is a circuit diagram of the FeRAM circuit unit 200 of FIG. 1.

The FeRAM circuit unit 200 comprises a main bit line load control unit 210 and a plurality of sub cell arrays 220.

Here, the main bit line load control unit 210 comprises a PMOS transistor P1 for controlling sensing load of a main bit line MBL. The PMOS transistor P1 has a source to receive the power voltage VCC, a drain connected to the main bit line MBL and a gate to receive a main bit line control signal MBLC.

The sub cell array 220 has a hierarchical bit line structure comprising a plurality of main bit lines MBL and a plurality of sub bit lines SBL. Each main bit line MBL of the sub cell array 220 is selectively connected to one of the plurality of sub bit lines SBL. That is, when one of a plurality of sub bit line selecting signals SBSW1 is activated, a NMOS transistor N5 is turned on to activated one of the sub bit lines SBL. Also, a plurality of cells C are connected to one of the sub bit lines SBL.

When a sub bit line pull-down signal SBPD is activated to turn on a NMOS transistor N3, the sub bit line SBL is pulled down to a ground level. A sub bit line pull-up signal SBPU is to control a power supplied to the sub bit line SBL. That is, a voltage higher than the power voltage VCC is generated at a low voltage, and supplied to the sub bit line SBL.

A sub bit line selecting signal SBSW2 controls the connection between a sub bit line pull-up signal SBPU terminal and the sub bit line SBL depending on the switching operation of a NMOS transistor N4.

A NMOS transistor N2, connected between a NMOS transistor N1 and the main bit line MBL, has a gate to connected to the sub bit line SBL. The NMOS transistor N1, connected between a ground voltage terminal and the NMOS transistor N2, has a gate to receive a main bit line pull-down signal MBPD, thereby regulating the sensing voltage of the main bit line MBL.

Figure 5:
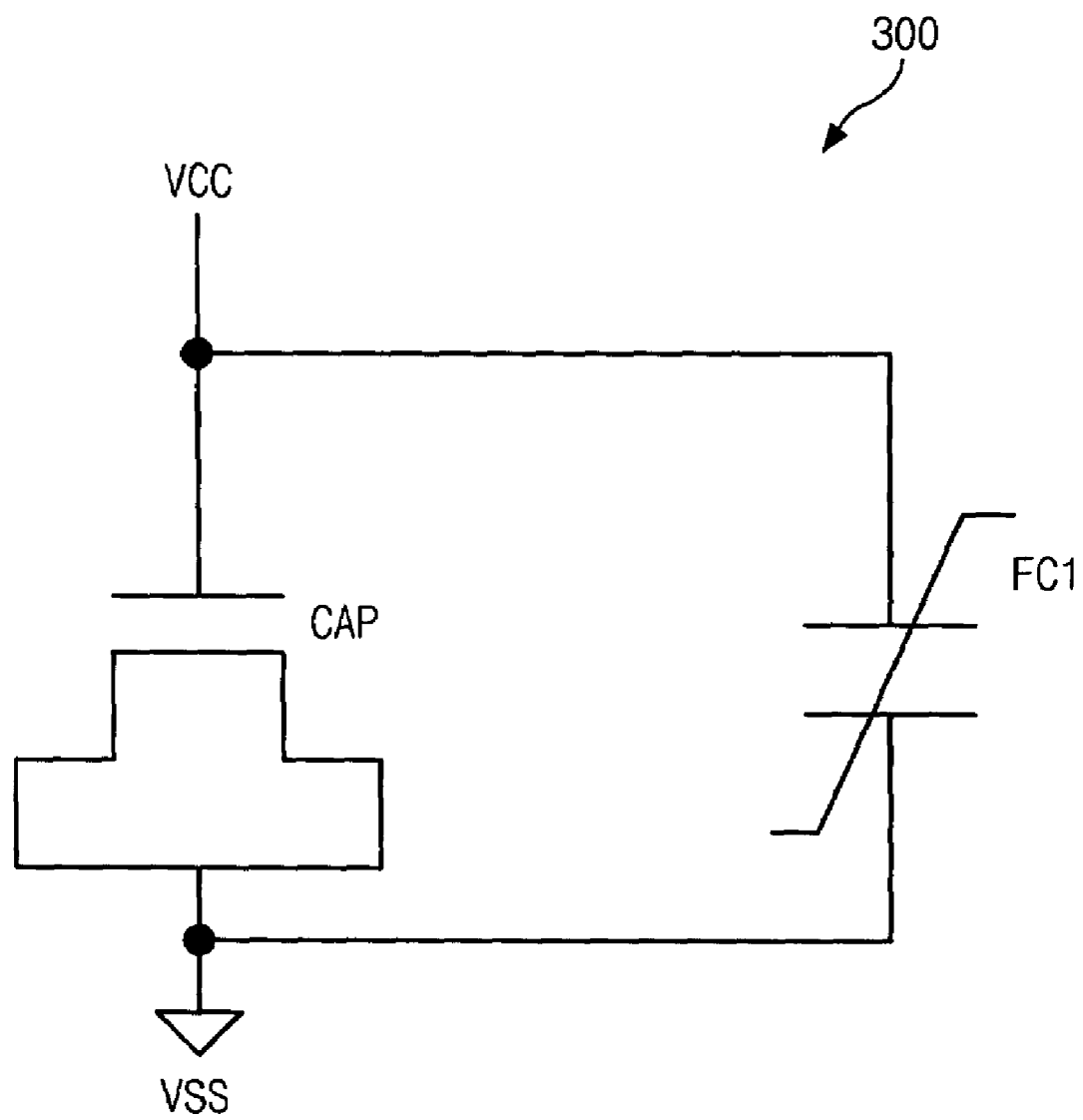
FIG. 5 is a circuit diagram of a power stabilization unit according to an embodiment of the present invention.

FIG. 5 is a circuit diagram of the power stabilization unit 300 of FIG. 1.

The power stabilization unit 300 comprises a capacitor CAP and a ferroelectric capacitor FC1 for stabilizing the power voltage VCC.

Here, the capacitor CAP, connected between the power voltage VCC terminal and the ground voltage terminal, has a NMOS gate capacitor structure. The ferroelectric capacitor FC1 is connected in parallel to the capacitor CAP.

Here, when the ferroelectric capacitor FC1 which occupies a relatively small area for stabilization of the power voltage VCC is used to obtain capacitance of high capacity, the reliability of the capacitor can be improved at a high voltage.

Here, the power stabilization unit 300 can comprise at least one of the capacitor CAP and the ferroelectric capacitor FC1 in order to remove noise of the power voltage VCC or can use both of the capacitor CAP and the ferroelectric capacitor FC1 if necessary.

Figure 6:
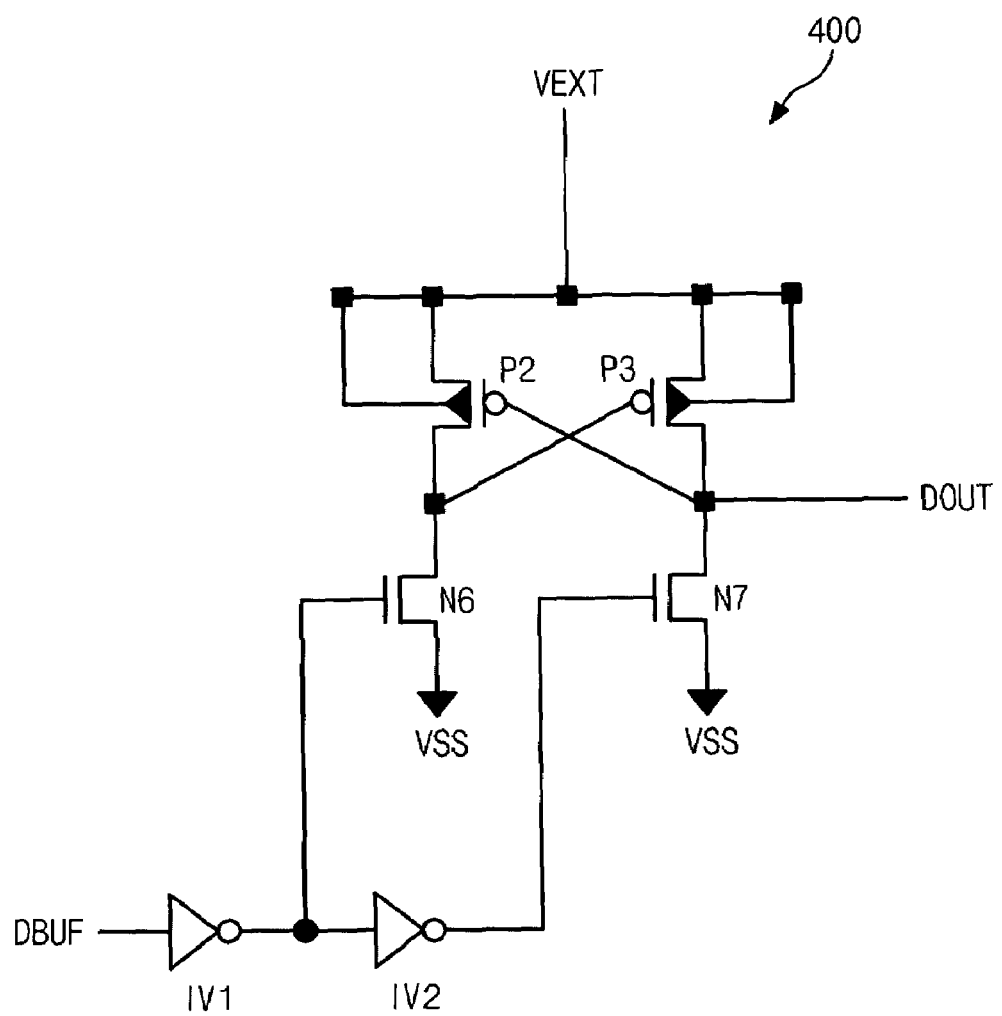
FIG. 6 is a circuit diagram of a level shifter according to an embodiment of the present invention.

FIG. 6 is a circuit diagram of the level shifter 400 of FIG. 1.

The level shifter 400 comprises PMOS transistors P2 and P3, NMOS transistors N6 and N7, and inverters IV1 and IV2.

The cross-coupled PMOS transistors P2 and P3 have a common source to receive the external power voltage. The inverter IV1 inverts the output data DBUF applied from the FeRAM circuit unit 200, and the inverter IV2 inverts an output signal from the inverter IV1.

An NMOS transistor N6, connected between a drain of the PMOS transistor P2 and a ground voltage terminal, has a gate to receive the output signal from the inverter IV1. An NMOS transistor N7, connected between a drain of the PMOS transistor P3 and the ground voltage terminal, has a gate to receive an output signal from the inverter IV2. As a result, data having opposite polarity are inputted to gates of the NMOS transistors N6 and N7.

The level shifter 400 generates output data DOUT shifted to the external power voltage VEXT level through a common drain of the PMOS transistor P3 and the NMOS transistor N7.

Figure 7A:
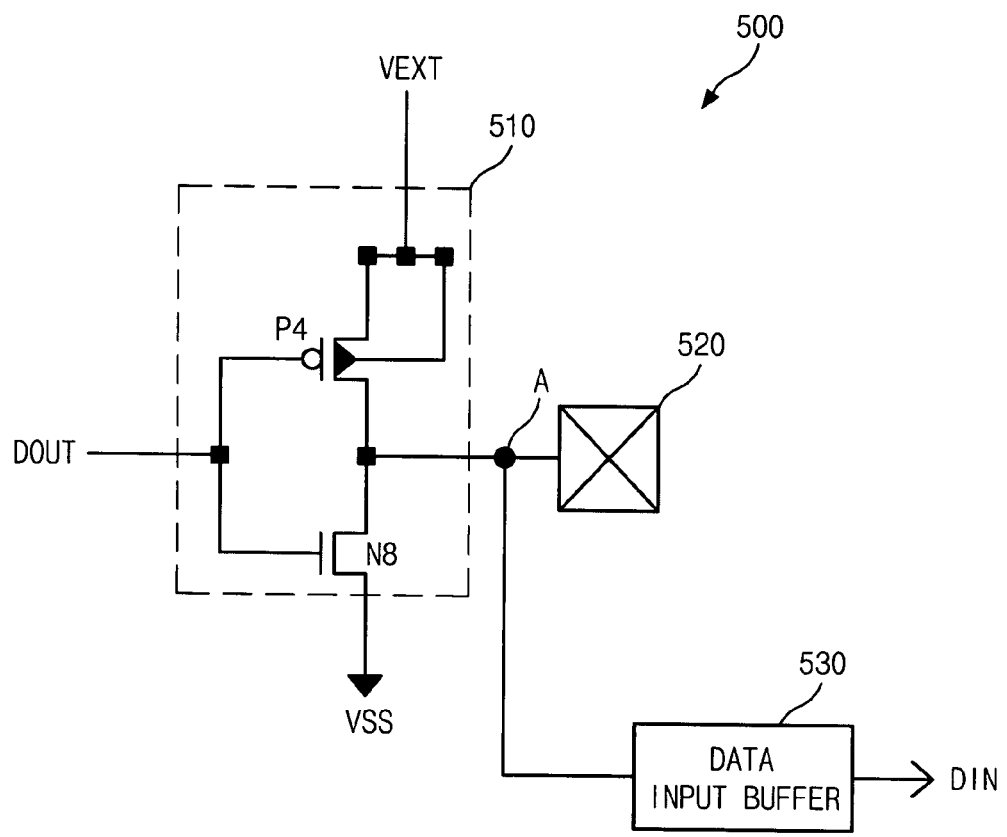
FIGS. 7a and 7b are circuit diagrams of an input/output unit according to an embodiment of the present invention.
Figure 7B:
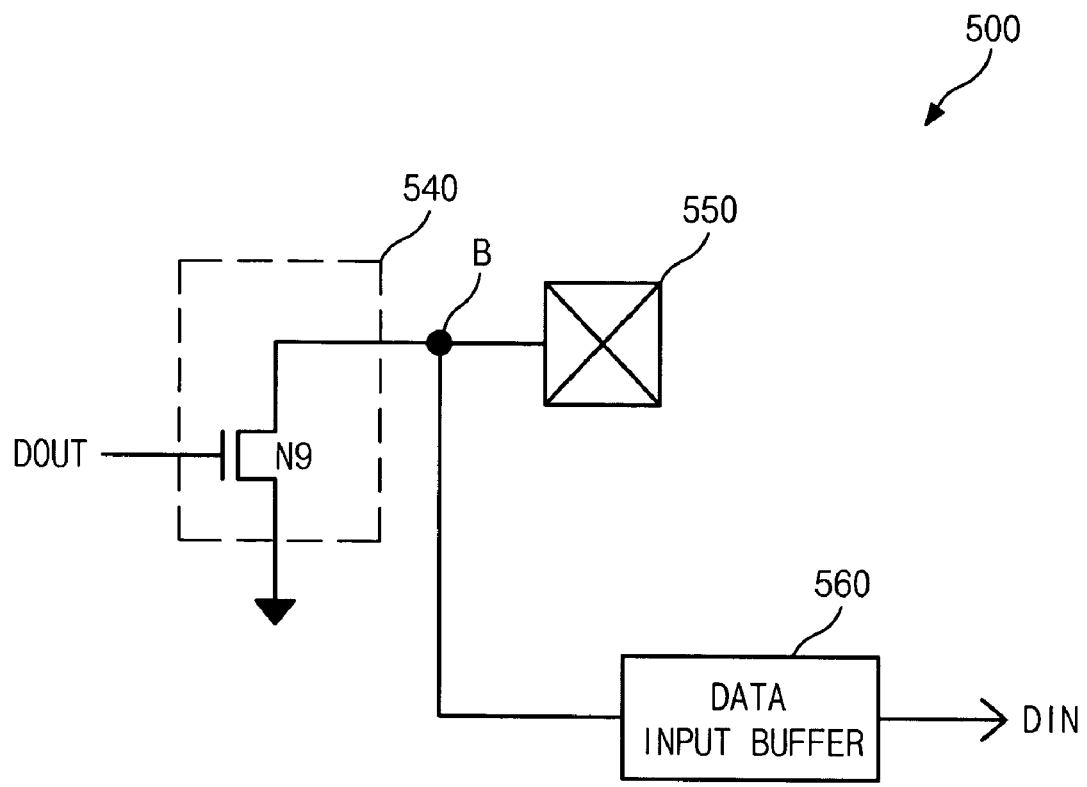

FIGS. 7a and 7b are circuit diagrams of the input/output unit 500 of FIG. 1.

The input/output unit 500 of FIG. 7a having a pull-up/pull-down CMOS type comprises an data output buffer 510, an input/output pad 520 and a data input buffer 530.

The data output buffer 510 comprises a PMOS transistor P4 and a NMOS transistor N8 which are connected serially between the external power voltage VEXT terminal and the ground voltage terminal. The output data DOUT applied from the level shifter 400 is inputted to a common gate of the PMOS transistor P4 and the NMOS transistor N8. A common drain of the PMOS transistor P4 and the NMOS transistor N8 is connected to the input/output pad 520.

The data input buffer 530 connected to a node A buffers the input data DIN applied from the input/output pad 520, and outputs the buffered data to the FeRAM circuit unit 200.

The above-described input/output unit 500 selectively supplies the output data DOUT having the external power voltage VEXT level or the output data DOUT having the ground voltage VSS level to the node A.

When the output data DOUT is 'high', the NMOS transistor N8 is turned on so that the data having the ground voltage VSS level is outputted to the input/output pad 520. On the other hand, when the output data DOUT is 'low', the PMOS transistor P4 is turned on so that data having the external power voltage VEXT level is outputted to the input/output pad 520.

The input/output unit 500 of FIG. 7b having an open drain type comprises a data output buffer 540, an input/output pad 550 and a data input buffer 560.

Here, the data output buffer 540 comprises a NMOS transistor N9 connected between a node B and the ground voltage terminal. The NMOS transistor N9 has a gate to receive the output data DOUT applied from the level shifter 400, and a drain connected to the input/output pad 550.

The data input buffer 560 connected to the node B buffers the input data DIN applied from the input/output pad 550 to the FeRAM circuit unit 200.

The above-described input/output unit 500 outputs the output data DOUT having the ground voltage VSS level to the node B.

When the output data DOUT is 'high', the NMOS transistor N9 is turned on so that data having the ground voltage VSS level is outputted to the input/output pad 550.

Figure 8A:
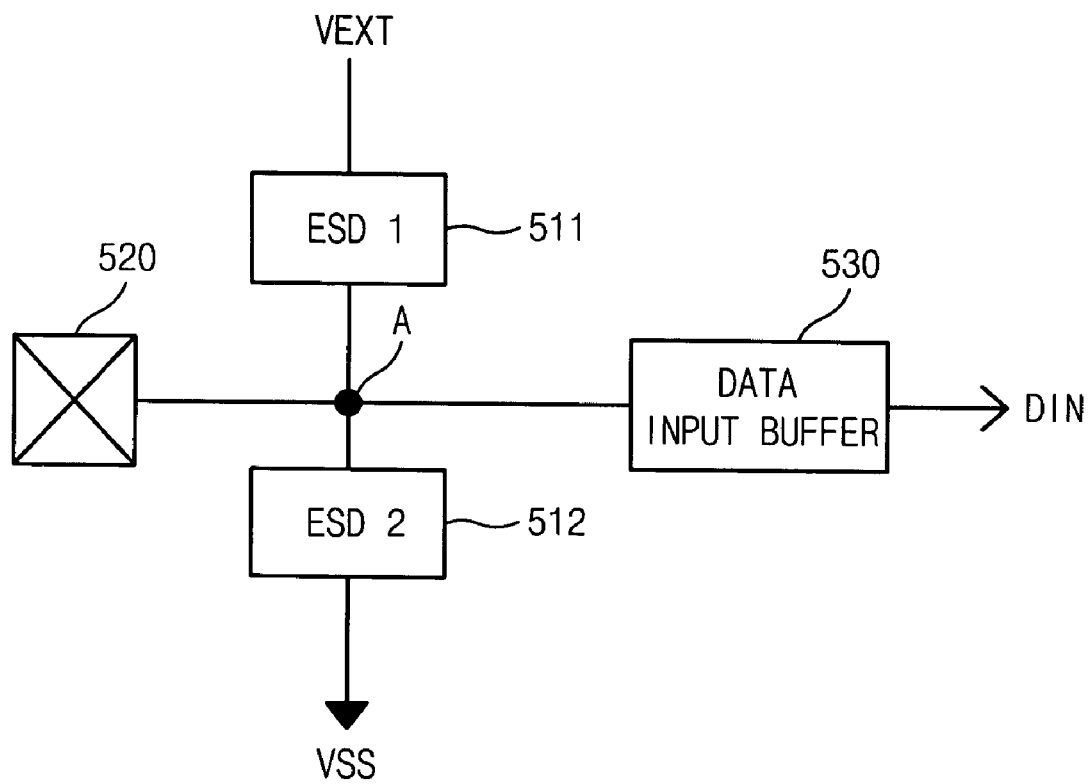
FIGS. 8a and 8b are diagrams illustrating the input/output unit according to an embodiment of the present invention.
Figure 8B:
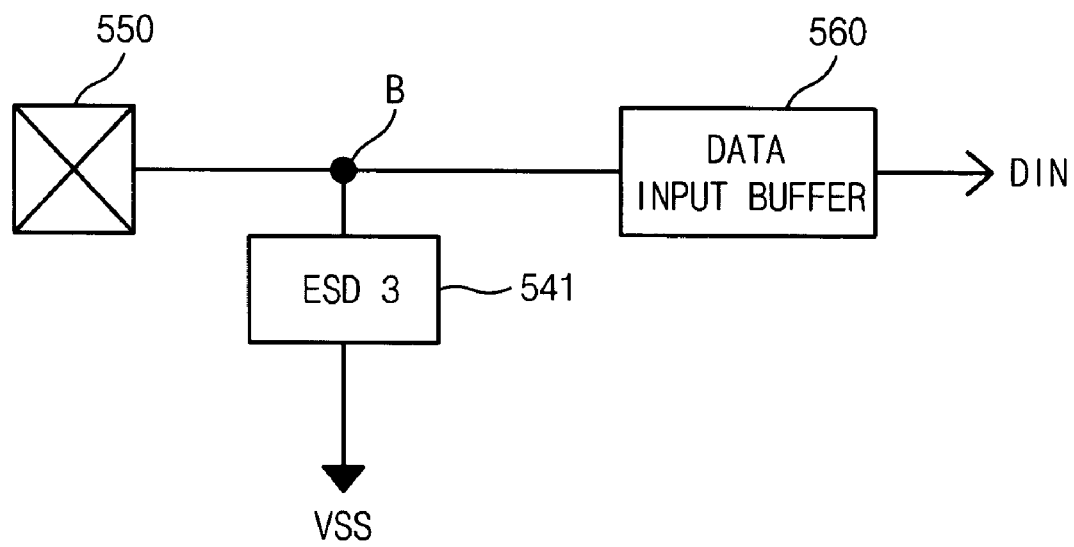

FIGS. 8a and 8b are diagrams illustrating the input/output unit 500 of FIG. 1.

The input/output unit 500 of FIG. 8a has the configuration corresponding to that of FIG. 7a. In the input/output unit 500, electrostatic discharge units 511 and 512 for performing an electrostatic discharge function are connected to the node A between the input/output pad 520 and the data input buffer 530.

The electrostatic discharge unit 511, connected between the external power voltage VEXT terminal and the input/output pad 520, discharges electro static applied from the input/output pad 520. The electrostatic discharge unit 511 which corresponds to the PMOS transistor P4 of FIG. 7a improves the ESD (Electro Static Discharge) efficiency of the node A.

The electrostatic discharge unit 512, connected between the ground voltage VSS terminal and the input/output pad 520, discharges electro static applied from the input/output pad 520. The electrostatic discharge unit 512 which corresponds to the NMOS transistor N8 of FIG. 7a improves the ESD efficiency of the node A.

The input/output unit 500 of FIG. 8a controls the FeRAM circuit unit 200 to have a stable voltage level when the input/output unit 500 receives a low power voltage level (for example, 3V).

The input/output unit 500 of FIG. 8b has the configuration corresponding to that of FIG. 7b. In the input/output unit 500, an electrostatic discharge unit 541 for performing an electrostatic discharge function is connected to the node B between the input/output pad 550 and the data input buffer 560.

The electrostatic discharge unit 541 which corresponds to the NMOS transistor N9 of FIG. 7b improves the ESD efficiency of the node B. The electrostatic discharge unit 541 connected between the ground voltage VSS terminal and the input/output pad 550 discharges electro static applied from the input/output pad 550.

The input/output unit 500 of FIG. 8b prevents unnecessary current from being applied to the data input buffer 560 when a high power voltage level (for example, 5V) is supplied.

Since the embodiment of FIG. 8b does not comprise the electrostatic discharge unit 511 in comparison with that of FIG. 8a, the efficiency of the whole system area is improved.

Figure 9:
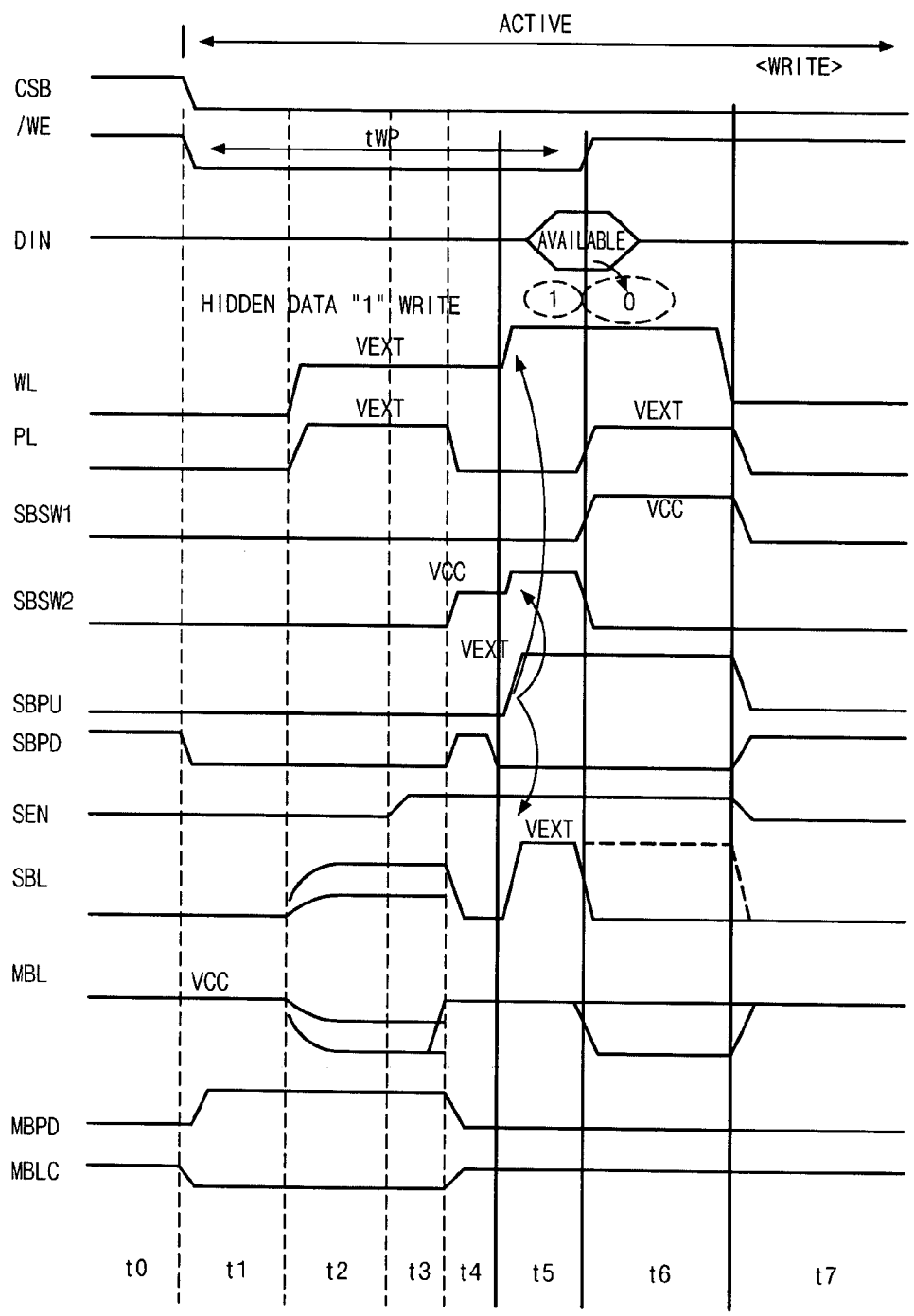
FIG. 9 is a timing diagram illustrating of the write operation of the nonvolatile FeRAM device having a power control function according to an embodiment of the present invention.

FIG. 9 is a timing diagram illustrating of the write operation of the nonvolatile FeRAM device having a power control function according to an embodiment of the present invention.

When an interval t1 starts, an address is inputted, a chip selecting signal CSB and a write enable signal/WE are disabled to 'low', the nonvolatile FeRAM becomes at a write mode active state. The sub bit line pull-down signal SBPD and the main bit line control signal MBLC are disabled to 'low', the power voltage VCC is applied to the main bit line MBL. Here, the main bit line pull-down signal MBPD is enabled.

Thereafter, when an interval t2 starts, a word line WL and a plate line PL are enabled to the external power voltage VEXT level, the voltage levels of the sub bit line SBL and the main bit line MBL rise.

When an interval t3 starts, a sense amplifier enable signal SEN is enabled, and cell data applied to the main bit line MBL.

Thereafter, when an interval t4 starts, the plate line PL is disabled to 'low', the sub bit line selecting signal SBSW2 is enabled to the power voltage VCC level. Then, the sub bit line pull-down signal SBPD is enabled to 'high', and the sub bit line SBL is disabled to 'low'. Here, the main bit line pull-down signal MBPD is disabled to 'low', and the main bit line control signal MBLC is enabled.

Next, in an interval t5, effective data are applied to the cell, and hidden data "1" is written. Then, the voltage of the word line WL rises, and the sub bit line selecting signal SBSW2 is enabled to the pumping voltage level VPP level in response to the sub bit line pull-up signal SBPU. As a result, the voltage level of the sub bit line SBL rises to the external power voltage VEXT level.

In an interval t6, data are written in response to the write enable signal/WE. When the interval t6 starts, the plate line PL is enabled to the external power voltage VEXT level again. Then, the sub bit line selecting signal SBSW1 is enabled to the power voltage VCC level, and the sub bit line selecting signal SBSW2 is disabled, thereby writing new data in a page cell.

When an interval t7 starts, the word line WL, the plate line PL, the sub bit line selecting signal SBSW1, the sub bit line pull-up signal SBPU and the sense amplifier enable signal are disabled. Then, the sub bit line pull-down signal SBPD is enabled.

Figure 10:
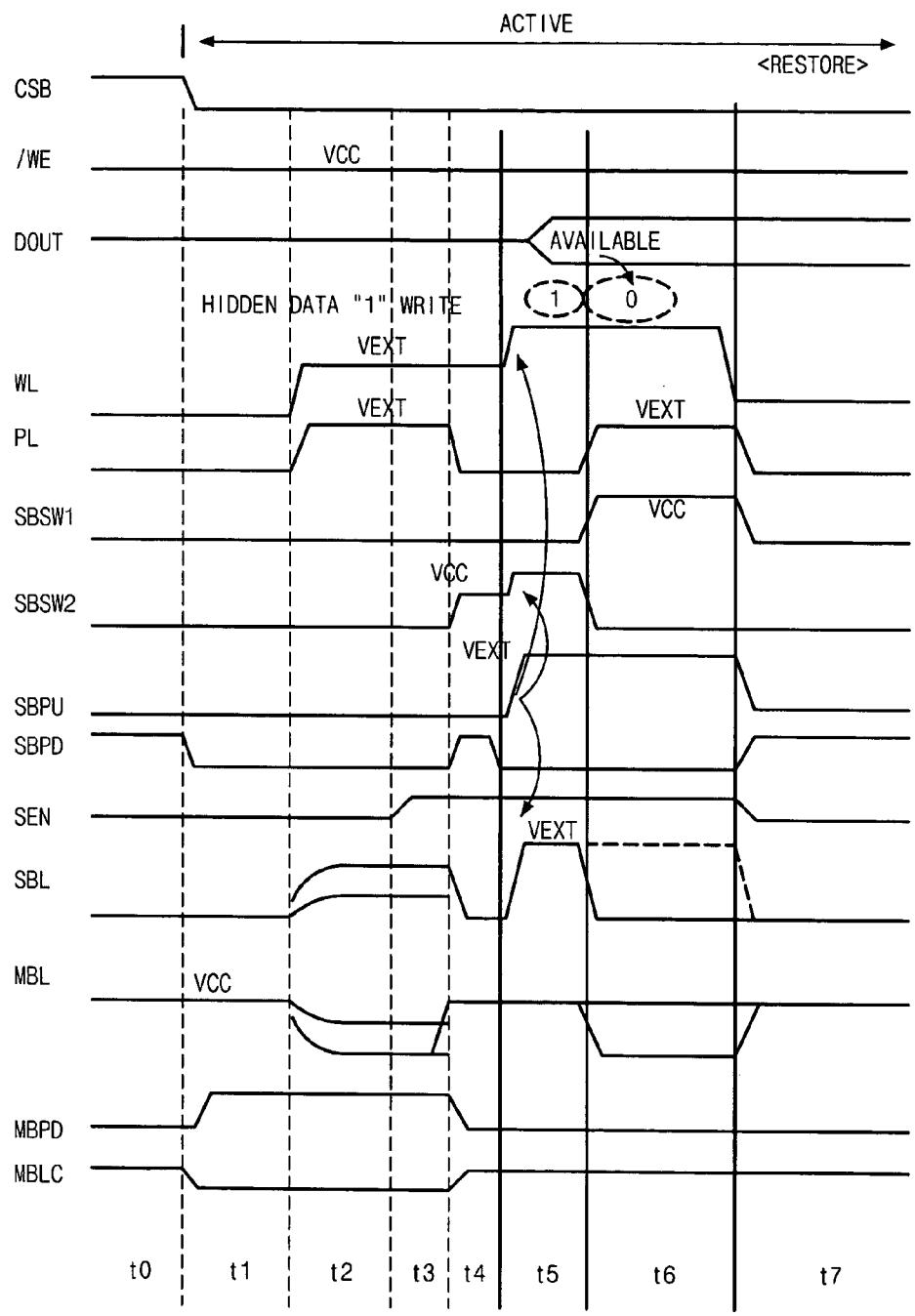
FIG. 10 is a timing diagram illustrating of the read operation of the nonvolatile FeRAM device having a power control function according to an embodiment of the present invention.

FIG. 10 is a timing diagram illustrating of the read operation of the nonvolatile FeRAM device having a power control function according to an embodiment of the present invention.

In the read mode, the write enable signal/WE is maintained at the power voltage VCC level. In intervals t2 and t3, data are sensed. In an interval t5, hidden data "1" is written, and high level data are written in all cells of the page. During intervals t6~t8, data output effective period is maintained.

In the interval t6, the plate line PL transits to 'high', the sub bit line selecting signal SBSW1 transits to 'high', and restoration data are written in the cell of the page.

As described above, in the write/read operations according to an embodiment of the present invention, the external power voltage VEXT is supplied to the word line WL, the plate line PL, the sub bit line pull-up signal SBPU and the sub bit line SBL, thereby increasing the operation voltage of the cell.

Accordingly, a nonvolatile FeRAM device according to an embodiment of the present invention provides the following effects: to improve a sensing margin of a cell and reduce unnecessary power consumption by controlling an operating voltage of the cell depending on an external supply voltage and applying a power voltage VCC obtained by dropping an external power voltage to adjacent circuits; to stabilize power by embodying a different configuration of an Electro Static Discharge (hereinafter, referred to as "ESD") for performing an electrostatic discharge function in an input/output unit corresponding to voltage levels of various operating powers; and to simplify configuration of a system board and vary a regulation range of power by positioning a power supply circuit not in the outside but in the inside of a chip.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A nonvolatile ferroelectric memory device having a power control function, comprising:
   a voltage drop unit for dropping an external power voltage to supply a power voltage;
   a nonvolatile ferroelectric circuit unit comprising a nonvolatile ferroelectric capacitor for reading/writing data stored in a cell depending on the power voltage;
   a level shifter for shifting data read from the nonvolatile ferroelectric circuit unit to the external power voltage level;
   an input/output unit driven by the level of the external power voltage, and for buffering input data and output data of the level shifter to control input/output operations; and
   a power stabilization unit for removing noise from the power voltage applied from the voltage drop unit to provide a stabilized voltage,
   wherein the power stabilization unit comprises a capacitor and a ferroelectric capacitor connected in parallel and between a power voltage terminal and a ground voltage terminal, for stabilizing the power voltage.

2. The nonvolatile ferroelectric memory device according to claim 1, wherein the power stabilization unit comprises a capacitor, connected between a power voltage terminal and a ground voltage terminal, for stabilizing the power voltage.

3. The nonvolatile ferroelectric memory device according to claim 2, wherein the capacitor is a NMOS gate MOS capacitor.

4. The nonvolatile ferroelectric memory device according to claim 1, wherein the voltage drop unit comprises:
   a voltage drop drive unit comprising a plurality of voltage drop means for dropping the external power voltage to output the power voltage; and
   a switching unit for selectively using the plurality of voltage drop means.

5. The nonvolatile ferroelectric memory device according to claim 4, wherein the plurality of voltage drop means are PN diode devices connected serially between an external power voltage terminal and a power voltage terminal.

6. The nonvolatile ferroelectric memory device according to claim 4, wherein the switching unit comprises a plurality of switches which are connected in parallel to the plurality of voltage drop means and selectively switched.

7. The nonvolatile ferroelectric memory device according to claim 1, wherein the nonvolatile ferroelectric circuit unit comprises:
   a main bit line load control unit for controlling load of a main bit line depending on selective supply of the power voltage; and
   a plurality of sub cell arrays each having a hierarchical bit line structure including a plurality of sub bit lines connected to one of the plurality of main bit lines, each sub cell array for reading/writing cell data in the nonvolatile ferroelectric capacitor depending on the power voltage.

8. The nonvolatile ferroelectric memory device according to claim 1, wherein the level shifter comprises:
   a first driving unit and a second driving unit which are cross-coupled, and having a common source to receive the external power voltage;
   a first inverter for inverting output data of the nonvolatile ferroelectric circuit unit to output a first driving signal;
   a third driving unit switched by the first driving signal, and for controlling the driving operation of the second driving unit;
   a second inverter for inverting the first driving signal to output a second driving signal; and
   a fourth driving unit switched by the second driving signal, and for controlling the driving operation of the first driving unit.

9. The nonvolatile ferroelectric memory device according to claim 8, wherein the first driving unit and the second driving unit are PMOS transistors.

10. The nonvolatile ferroelectric memory device according to claim 8, wherein the third driving unit and the fourth driving unit are NMOS transistors.

11. The nonvolatile ferroelectric memory device according to claim 1, wherein the input/output unit comprises:
    an input/output pad where the output data and the input data are inputted/outputted;
    a data output buffer for selectively outputting the external power voltage or a ground voltage to the input/output pad depending on levels of the output data; and
    a data input buffer for buffering the input data applied from the input/output pad to output the buffered data to the nonvolatile ferroelectric circuit unit.

12. The nonvolatile ferroelectric memory device according to claim 11, wherein the data output buffer comprises a first PMOS transistor and a first NMOS transistor, which are connected serially between the external power voltage terminal and the ground voltage terminal, having a common gate to receive the output data and a common drain connected to the input/output pad.

13. The nonvolatile ferroelectric memory device according to claim 11, wherein the data output buffer comprises a second NMOS transistor, connected between the input/output pad and the ground voltage terminal, having a gate to receive the output data.

* * * * *